United States Patent [19]
Crafts

[11] Patent Number: 4,975,758
[45] Date of Patent: Dec. 4, 1990

[54] GATE ISOLATED I.O CELL ARCHITECTURE FOR DIVERSE PAD AND DRIVE CONFIGURATIONS

[75] Inventor: Harold S. Crafts, Fort Collins, Colo.

[73] Assignee: NCR Corporation, Dayton, Ohio

[21] Appl. No.: 360,691

[22] Filed: Jun. 2, 1989

[51] Int. Cl.$^5$ .................. H01L 27/10; H01L 27/15; H01L 27/02; H01L 23/48

[52] U.S. Cl. ........................... 357/45; 357/42; 357/41; 357/46; 357/22; 357/68

[58] Field of Search ............ 357/41, 68, 46, 22, 357/36, 56, 42, 45, 45.17

[56] References Cited

U.S. PATENT DOCUMENTS

| | | | |
|---|---|---|---|
| 3,967,305 | 6/1976 | Zuleeg | 357/45 X |
| 4,462,041 | 7/1984 | Glenn | 357/46 X |
| 4,602,270 | 7/1986 | Finegold et al. | 357/68 X |
| 4,733,288 | 3/1988 | Sato | 357/68 X |
| 4,825,107 | 4/1989 | Naganuma et al. | |

Primary Examiner—Rolf Hille
Assistant Examiner—Mahshid Saadat
Attorney, Agent, or Firm—Casimer K. Salys; Wilbert Hawk, Jr.

[57] ABSTRACT

An architecture for the input/output circuits and pads of a gate array integrated circuit product functionally configured during the formation and connection of one or more metallization layers. In a preferable practice of the invention, cells of first impurity type and second impurity type transistors are formed in respective parallel but spaced apart rows along the chip perimeters with a pad definition region lying therebetween. Successively adjacent cell transistors are contiguous as to source regions and are electrically separable by cell gate isolation. Preferably, the individual cell transistors have annular gate electrodes with centrally disposed and also fully isolatable drain regions. The input/output architecture of the present invention provides the gate array designer with the ability to selectively define pad size and spacing, to selectively utilize cells for I/O circuit functions, and to selectively isolate and cascade interconnect cell transistors to provide extended ranges of current drive and operating voltage.

12 Claims, 3 Drawing Sheets

GATE ISOLATED I.O CELL ARCHITECTURE FOR DIVERSE PAD AND DRIVE CONFIGURATIONS

CROSS-REFERENCE TO RELATED APPLICATIONS

The subject matter in the present application is somewhat related to the invention in U.S. patent application Ser. No. 07/297,355. The inventors and assignees are identical for such related applications.

Background of the Invention

The present invention relates generally to integrated circuit technology, and more particularly to those products generically identified as gate array integrated circuit devices. The invention defines an architecture for the input/output (I/O) segments of a gate array chip, and in doing so, identifies and solves a number of problems common to such devices.

The prevailing advantage of gate array type integrated circuit chips over other classes of application specific integrated circuit (ASIC) devices is the short cycle time between when a functional electronic circuit design is formalized and when a semiconductor chip product is available for customer/user evaluation. This advantage can be ascribed to a unique fabrication procedure used with gate array products. Namely, those fabrication operations which require significant time to execute are accomplished a priori by fabricating a generic chip layout, a base set, which incorporates numerous unconnected semiconductor transistors. Such partially completed chips are banked as semiconductor wafers in anticipation of customer specific functional designs. The functional specification defined by the customer is integrated into the generic chip through a set of personalization patterns, which define contacts to the pre-existing semiconductor devices through an overlying dielectric layer, at least one metalization interconnect pattern layer, and most often at least one via pattern for metal-to-metal pattern connection through another dielectric layer and to a second metalization layer. Recent designs have extended the interconnection schemes to three metalization layers.

In prescribing the various metalization layer patterns, the designer must not only define the logic circuits internal to the gate array but must also create the chip bonding pads and configure appropriate capability pad input and output driving circuits. Unfortunately, pad size, pad count, and pad drive requirements differ significantly while the banked wafers are preferably limited in variety.

A common problem for gate array product manufacturers is to define base sets which best match customer pad count and input/output drive requirements. For example, if the gate array product in the bank is based upon output pad driver elements capable of providing up to 8 milliamps of current, a representative value, and the specification of the customer requires even a single output pad to drive measurably more than such maximum current, all the functional capacity within the gate array is of little consequence. The opposite can also be true, wherein the output pad driving circuits have too great a capability and as a consequence consume too much chip area or unduly limit the number or location of the pads. Further complicating the situation of what a gate array designer should bank, is the fact that a customer may require one or very few of the pads to have a high current drive capability and an associated need for numerous input or low output drive pads. Thus, notwithstanding the fact that the gate array product concept exploits the speed with which metalization can be accomplished, there remains a need for gate array base set designs to exhibit significant versatility in pad count and pad drive capability.

As the number of functions incorporated into gate array type integrated circuits increases, the operating voltage specified by customers is expected to extend beyond the nominal 5 volts of $V_{DD}$. Though such higher voltage levels are not expected to be routed within the interior of the gate array chip, it is clearly advantageous if the gate array base sets are capable of being reconfigured to regulate such higher voltages at the input/output pad driver stages. The trend to high voltages is particularly evident with the increasing number of integrated circuit designs which interface or process analog signals.

SUMMARY OF THE INVENTION

The present invention defines an improved architecture for the input/output elements routinely extending along the periphery of gate array integrated circuit chips. The architecture is integral to the base set design, yet provides an exceptional degree of latitude during the functional personalization as implemented through the metalization patterns. Such customer specific refinements permit not only selectivity as to the output drive circuit by pad, but extends to include the actual pad count as well as specialized drive circuit configurations to handle elevated voltage levels.

The improved architecture is characterized by the presence of two parallel rows of field effect transistors cells, respectively complementary, along the perimeter of the chip, separated by a region suitable for pad formation. Typical pad dimensions extend along the perimeter to a distance of 4-20 transistor cells. The cell transistors themselves are composed of a central drain region isolated by an annular channel, defined by a coextensive gate electrode, from source electrode regions. The source regions lie along opposite edges of the cell, and as such, are in common with the sources of the immediately adjacent cells. Preferably, the source region of each cell is bisected by the cell channel and common gate electrode to practice gate isolation in the manner generally known in the prior art. Gate isolation facilitates the cascade connection of transistors in a manner suitable to elevate the voltage handling capabilities of the composite structure.

The cell transistors are interconnected during metalization to match the output pad in dimensions, current drive requirements, or voltage expectations.

These and other features of the invention will be more clearly understood and appreciated upon considering the detailed embodiment which is described hereinafter.

DESCRIPTION OF THE PREFERRED EMBODIMENT

Figure 1:
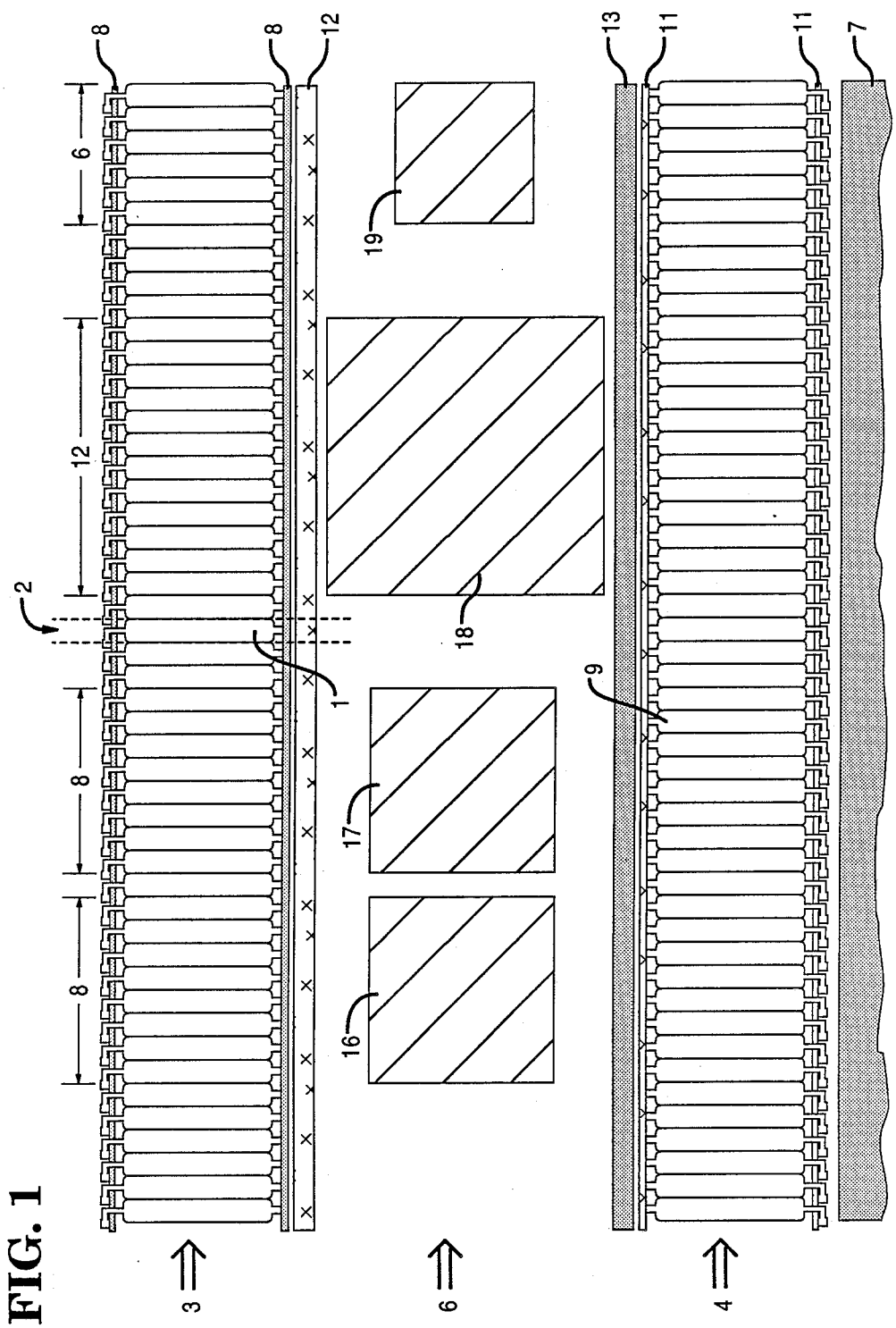
FIG. 1 schematically illustrates a segment of a row of I/O cells with exemplary pads.
Figure 2:
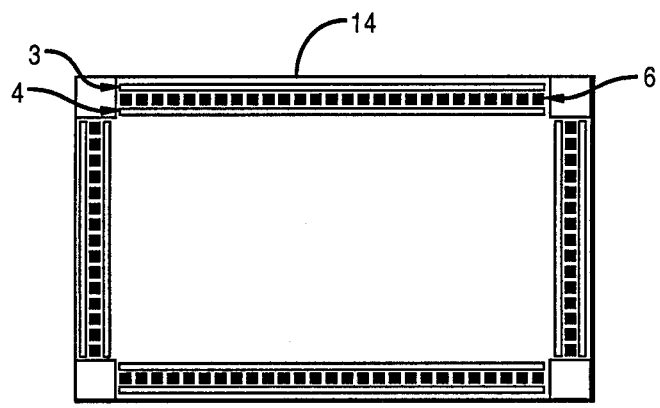
FIG. 2 is a schematic of a chip I/O pad architecture implemented according to the invention.

A gate array integrated circuit I/O architecture suitable to attain the desired function, structure and manufacturing objectives is illustrated at the cell and pad level of definition in FIG. 1. A chip 14 level depiction of the architecture is shown in FIG. 2. With reference to FIG. 1, note that the individual cells 1 of nominal width 2 are configured to be successively adjacent in parallel rows 3 and 4. Rows 3 and 4 are separated by a pad definition region 6. The rows of cells and intermediate pad region extend along the full perimeter, excluding the corners, of a four sided semiconductor chip, as appears in FIG. 2.

For the illustration shown in FIG. 1, the interior of the chip lies to the bottom of the figure and is separated from the I/O cell and pad structure by guard ring type diffusion region 7. Guard ring 7 accentuates isolation of the I/O transistors to reduce the likelihood of a latchup condition within the gate array interior.

In the preferred form, the transistors within cell 1 of row 3 are n-channel field effect devices, and are, as will be described hereinafter, functionally separable by gate isolation. Row 3 of field effect transistor cells 1 is bounded by a pair of guard ring p+ diffusions regions 8. A similar situation exist for the p-channel transistor cells 9 in row 4, show bounded by n+ guard band diffusion regions 11. Note the further presence of complementary impurity type guard bands 12 and 13 between each of the cell rows and the pad region 6.

Directing attention to FIG. 1 again, note that the base set I/O architecture shown involves parallel rows of immediately adjacent cells whose individual spacing dimension 2 is significantly smaller than the sizes of representative pads 16, 17, 18, or 19. Thereby, it becomes feasible to match during metalization the pad size, pad location, and pad drive requirements to the functional specification of the chip. For example, if the functional design of the customer involves a low pad count, large pads, such as pad 18, can be patterned and a correspondingly greater number of available driver transistors cells, in this case 12 p-channel and n-channel field effect transistors, can be utilized to fabricate this pad's input/output circuit. Since pads 16–19 are defined during the metalization operation, the gate array base set used with pads the size of 18 can also be used with a high pin count military product requiring pads of the relative size and spacing of 16 and 17. For pads 16 and 17, the average number of input/output cells available for each pad drive circuit decreased to 8. The even smaller size of pad 19 is representative of the relative pad size for advanced high pin count packaging technologies such as tape automated bonding.

It is also worth noting that the present I/O architecture permits a mixture of pad sizes, as may be necessary to meet the particularized needs of a customer, while utilizing the same gate array base set. For instance, it may be desirable to use a larger pad for a particular drive function, or to provide or supplement power supply or ground line connections at discretionary locations.

The use of a gate isolation architecture internal to cells 1 and 9 in rows 3 and 4 facilitates highly particularize subdivision and functional allocation of the cell transistors. For example, pads 16 and 17 may be situated within one cell spacing of each other while having full access to an equally apportioned share of at least 8 cell transistors for I/O circuit configuration. This accentuated efficiency of cell use is attributable to the availability of gate isolation in each cell. If, as preferably practiced, the source electrodes of such n-channel transistors in row 3 are connected to the ground bus, successive I/O circuit cells may abut. In reflection, the ability to locate pads and their I/O circuits in such immediate proximity, while retaining full integrated circuit cell functionality in proportioned dimensions provides the desired match of pad and I/O circuit flexibility within the context of a quick fabrication cycle gate array semiconductor chip product.

Figure 3:
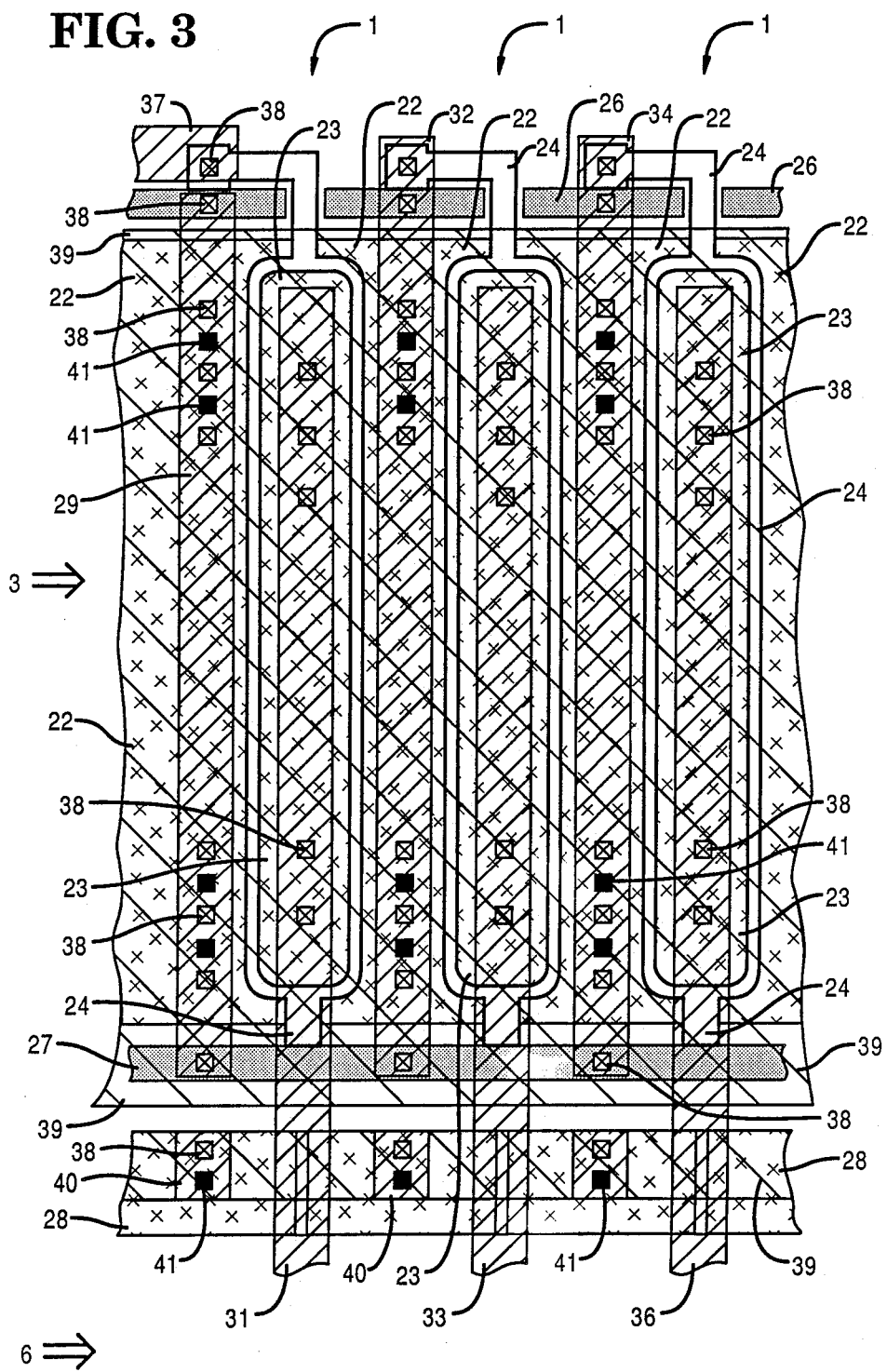
FIG. 3 is a schematic top view of three cells from within the rows of the I/O architecture, showing representative interior structures.

In addition to the unique input/output architecture at the macro level, the invention further contemplates and discloses a desirable structure for the interior of cell 1, a structure which is particularly suited to such I/O applications. FIG. 3 illustrates the internal architecture of three such representative cells 1 interconnected to provide driving and isolation functions. The illustrated cells are n-channel field transistor devices as would appear in row 3 of FIG. 1. The magnified depiction in FIG. 3 details the structure of the source/drain regions, the gate electrodes, the guard ring regions, various contacts and vias, and representative first and second metalization layer patterns.

The cells in FIG. 3 are shown to have heavily doped n-type source regions 22 (designated by an "X" pattern). The associated heavily doped n-type drain regions 23 (similarly designed by "X") are shown to be situated within the annular ring pattern of the polysilicon gate electrode 24, with a relatively coextensive underlying channel region in the silicon substrate of the semiconductor gate array chip. The gate electrode perimeter is distinguished by the thicker lines. Along the top and bottom of FIG. 3 there are shown heavily doped p-type guard ring diffusions 26 and 27 extending in parallel with the projection of row 3. A further guard ring diffusion 28, of heavy n-type doping, is shown to lie along the boundary with pad region 6.

The source 22 and drain 23 electrodes of the cell transistors depicted in FIG. 3 are connected to patterns of the first metalization layer 29, 31, 32, 33, 34, and 36 through a multiplicity of contacts 38, not all of which are actually depicted. Recall that the pattern of the first metalization layer partially interconnects the cell transistors to perform selected I/O circuit functions. For example, gate electrodes 24 of the center and right cell transistors are connected to metalization patterns 32 and 34 so that gate electrodes 24, guard rings 26 and 27, and source regions 22 situated beneath metalizations 32 and 34 are electrically common. In that configuration the corresponding cell transistors are disabled to provide one form of the aforenoted gate isolation function. In contrast, the transistor gate electrode connect to first level metalization 37 is responsive to the signal on metalization 37 in modulating the current conducted through the field effect transistor in the left cell.

A second level of metalization 39 is also depicted in FIG. 3. Connection between the second level metalization 39 and any first level metalization pattern, such as 29, is provided through a set of vias 41. As another example, guard ring diffusion 28 is connected to the second metalization layer 39 through intermediate first metalization layer patterns 40 using a succession of contacts 38 and vias 41.

The structure of the cells and incorporated transistors exhibits a number of unique and desirable features. For example, the annular disposition of the gate electrodes reduces the levels of voltage stress which typically appears at abrupt corners of integrated circuit field effect transistor structures. The annular gate and channel structure also provides complete isolation potential for each drain electrode. The extensions of the gate electrode at the top and bottom of FIG. 3, beyond the source diffusion regions 22, provide each cell with two electrically isolated source electrodes for independent connection and potential gate isolation. Gate isolation is particularly useful in configuring the input/output circuits of gate array chips having the present multiple and contiguous cell architecture. As noted before, gate isolation in a single cell allows selective partitioning of cells into functional groups based upon current drive requirements, pad dimensional requirements, or high voltage drive requirements of the form described hereinafter.

The ability to isolate one or more cells from a row of contiguous cells in the I/O structure also facilitates cascade form configurations suitable to handle abnormally high voltages. Cell transistors are connected in series to share the voltage stress. Thereby, voltages which could not be regulated by conventional gate array integrated circuit chips are susceptible to control within the input/output driver stages of the gate array architecture.

Figure 4:
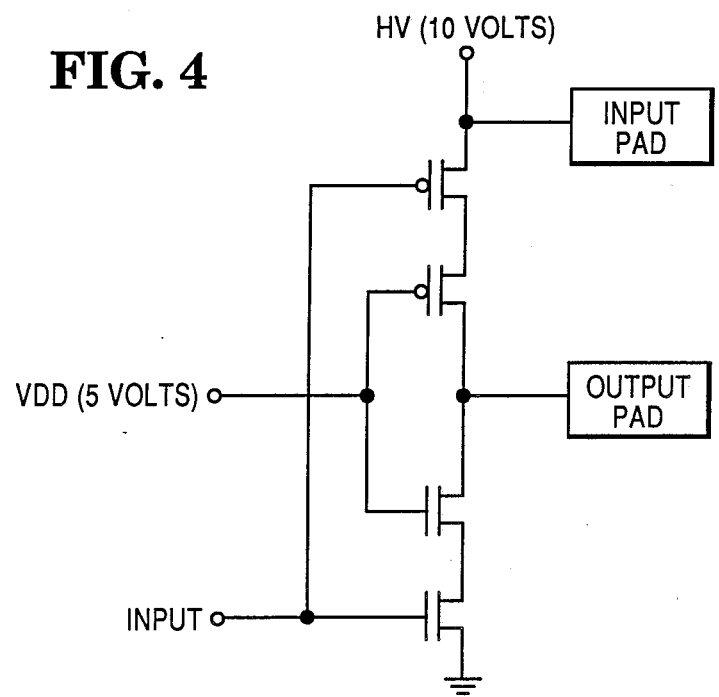
FIG. 4 is a schematic of a high voltage cascode connected I/O driver circuit.

FIG. 4 illustrates a circuit embodiment in which 10 volts is provided through an input pad and regulated to drive an output pad using an integrated circuit gate array designed to operate at a $V_{DD}$ of 5 volts. The ability to form gate array integrated circuits which regulate voltages in excess of the 5 volts $V_{DD}$ convention is particularly important in analog drive applications. If the n-channel transistor cells in FIG. 3 are situated in a p-well subject to a negative bias voltage, the present gate array design can also be configured directly or in a cascade arrangement to regulate I/O pad voltages which swing both positive and negative of the ground potential.

When chip substrate 14 (FIG. 2) is of p-type impurity, and the n-channel transistors in row 3 are formed within a p-type well, a lateral npn bipolar transistor can be created by connecting a first metalization patterns 31, 33 or 36 to one of drain diffusions 23. Such a transistor can be used in a gate array product to introduce signals having voltages below the ground potential of the chip, as a means of initiating test functions in the manner described in U.S. Pat. No. 4,714,876. For the configuration illustrated in FIG. 3, an n+ diffusion 28 would serve as the bipolar transistor collector electrode, the p-well would be the base electrode, and the drain 23 would serve as the emitter electrode. Though the gain of such bipolar transistor would be significantly less than one, the transistor would nevertheless be capable of being enabled, by pulling the cell drain, the bipolar transistor emitter electrode, negative of ground while holding the p-well, the bipolar transistor base electrode, at ground potential.

The input/output architecture of the present invention thereby provides a gate array design which retains the short fabrication cycle expected of gate array type integrated circuits while providing a significantly greater degree of flexibility as to pad count, pad dimensions, input/output circuit functionality, output circuit current drive capability and output circuit voltage handling capability. These features are obtained through the use of a CMOS input/output cell architecture in which contiguous cells of particularized interior configuration are arranged in parallel rows of complementary type with a pad definition region therebetween.

It will be understood by those skilled in the art that the embodiments set forth hereinbefore are merely exemplary of the various element and usage essential to the present invention, and as such may be replaced by equivalents without departing from the invention thereof, which now will be defined by appending claims.

I claim:

1. In a base set of a gate array integrated circuit chip using pads to convey input and output electrical signals and metalization layers to interconnect the semiconnector regions, improvements comprising:
   a first row of successively adjacent first conductivity type transistor cells situated along a first edge of the chip;
   a second row of successively adjacent second, opposite that of the first, conductivity type transistor cells parallel to the first row and situated generally along the first edge of the chip; and
   a pad definition region between the first and the second rows of cells.

2. The improvements recited in claim 1, wherein the first and second rows are bounded along both edges by diffusions of conductivity type opposite that of the transistors in the associated row.

3. The improvements recited in claim 2, wherein comparable rows exist on all four sides of the gate array integrated circuit chip.

4. The improvements recited in claim 3, wherein the width of a pad along the pad definition region is nominally between 4 and 20 times the width of the individual cells in the bordering rows.

5. The improvements recited in claim 1, wherein the cells are composed of field effect transistors which share source regions at two cell edges.

6. The improvements recited in claim 5, wherein the shared source regions at the two edges of a cell are separated by a channel region responsive to a first gate electrode.

7. The improvements recited in claim 6, wherein the drain region of a cell field effect transistor is bounded by an annular channel region aligned to a second gate electrode.

8. The improvements recited in claim 7, wherein the first and second gate electrodes are conductively common.

9. The improvements recited in claim 8, wherein the first and second rows are bounded along both edges by diffusions of conductivity type opposite that of the transistors in the associated row.

10. The improvements recited in claim 9, wherein comparable rows exist on all four sides of the gate array integrated circuit chip.

11. The improvements recited in claim 10, wherein the width of a pad along the pad definition region is nominally between 4 and 20 times the width of the individual cells in the bordering rows.

12. An integrated circuit chip comprising:
   two parallel rows of I/O cells situated along an edge of the chip; and
   an I/O pad between said rows and driven by selected cells from both of said rows.

* * * * *